(12) United States Patent
Liu (10) Patent No.: US 7,736,947 B2
(45) Date of Patent: Jun. 15, 2010

(54) METHOD USING A CARRIER FOR MANUFACTURING A MEMORY DEVICE AND MANUFACTURING METHOD OF A MEMORY DEVICE USING THE SAME AND MEMORY DEVICE USING THE SAME

(75) Inventor: Chao-Te Liu, Pingtung County (TW)

(73) Assignee: Phison Electronics Corp., Hsinchu (TW)

( * ) Notice: Subject to any disclaimer, the term of this patent is extended or adjusted under 35 U.S.C. 154(b) by 367 days.

(21) Appl. No.: 11/768,023

(22) Filed: Jun. 25, 2007

(65) Prior Publication Data

US 2008/0256293 A1    Oct. 16, 2008

(30) Foreign Application Priority Data

Apr. 14, 2007    (TW) .............................. 96113187 A (51) Int. Cl.
*H01L 21/44* (2006.01)
*H01L 21/48* (2006.01)
*H01L 21/50* (2006.01)

(52) U.S. Cl. .................. 438/106; 438/238; 438/381; 257/E21.497; 257/E21.499; 257/E21.509; 257/E21.645

(58) Field of Classification Search ................ 438/106, 438/107, 238, 381; 257/E21.497, 499, 509, 257/645

See application file for complete search history.

(56) References Cited

U.S. PATENT DOCUMENTS

| | | | | |
|---|---|---|---|---|
| 4,953,460 A | * | 9/1990 | Wojcik | 101/129 |
| 5,129,573 A | * | 7/1992 | Duffey | 228/180.1 |
| 5,277,749 A | * | 1/1994 | Griffith et al. | 216/40 |
| 5,804,248 A | * | 9/1998 | Hewett | 427/97.2 |
| 6,096,131 A | * | 8/2000 | Hewett | 118/504 |

\* cited by examiner

*Primary Examiner*—David Nhu
(74) *Attorney, Agent, or Firm*—J.C. Patents

(57) ABSTRACT

A carrier including a bottom plate, an intermediate cover, and a top cover for manufacturing a memory device is introduced herein. A printed circuit board is disposed on the bottom plate, and memory elements are arranged and disposed on the PCB. The intermediate cover is used to press peripheral regions of the printed circuit board, and to expose the regions where the memory elements are formed on the printed circuit board. The printed circuit board is closely attached to a surface of the bottom plate by fixing the intermediate cover. The top cover is used to cover the memory elements formed on the printed circuit board after some manufacturing processes, and by exerting an external force, the formed memory elements are clamped down, so as to protect the memory elements from being affected by the printed circuit board in the following thermal process due to the thermal stress deformation.

10 Claims, 12 Drawing Sheets

METHOD USING A CARRIER FOR MANUFACTURING A MEMORY DEVICE AND MANUFACTURING METHOD OF A MEMORY DEVICE USING THE SAME AND MEMORY DEVICE USING THE SAME

CROSS-REFERENCE TO RELATED APPLICATION

This application claims the priority benefit of Taiwan application serial no. 96113187, filed on Apr. 14, 2007. All disclosure of the Taiwan application is incorporated herein by reference.

BACKGROUND OF THE INVENTION

1. Field of the Invention

The present invention relates to a carrier for manufacturing a memory device, a method using the same, and a portable memory device using the manufacturing method.

2. Description of Related Art

In recent years, the technology and material of an electronic integrated circuit have been developed rapidly, and the volume of a chip is increasingly reduced, but the function becomes increasingly powerful and the applications thereof have been gradually reached anywhere. Therefore, the products manufactured by using the electronic integrated circuit gradually becomes light, thin, short, and small, such as electronic dictionaries, digital cameras, and various other digital products. Furthermore, because of the gradually mature chip packaging technology, in the current market, a single chip or multiple chips are packaged into a quite slim card, to form a removable memory with a volume smaller than that of an existed magnetic recording medium by utilizing the characteristic that the chip may store a large amount of data. Such electronic media are all called memory card.

Currently, SD (secure digital) memory card is one of the most commonly used memory cards. The SD memory card uses a standard of a flash memory, for example, and is applied in portable devices, such as digital cameras, personal digital assistants (PDA), and multi-media players. The technology of the SD memory card is formed based on a format of a multi-media card (i.e., so-called MMC), but the SD memory card is slightly thicker than the MMC. The SD memory card has a high data transmission rate and the standard with which the SD memory card uses is updated continually. The profile of the common SD memory card is about 32 mm×24 mm×2.1 mm.

In recent years, as the demand for data storage capacity is increased, and the development trends of electronic devices towards light weight, thinness, shortness, and smallness, the substrate area of the memory card is gradually reduced. A miniSD specification was also introduced for the SD cards in the year of 2003, so as to reduce the size of the memory card, for example, the size is about 20 mm×21.5 mm×1.4 mm.

However, as the size of the memory card is increasingly reduced, the size of the memory dies in the memory card is also reduced accordingly, and the used printed circuit board also becomes much thinner and smaller. Under this circumstance, a carrier used in the manufacturing process plays a crucial role. How to ensure the efficiency of the memory card and to protect the components in the memory card from being damaged becomes a topic deserving further consideration.

For example, the memory card meeting the miniSD specification requirement is only 1.4 mm in thick, so the thickness of the employed printed circuit board (PCB) must be lower than 0.16 mm. If such a specification is adopted, during the process of manufacturing the memory cards, PCB manufacturers cannot overcome the problem of the bending of the PCB, i.e., the bowing problem in the field, which also causes the problem that the components cannot be installed successfully by using the Surface Mounted Technology (SMT), or deformation occurs during the reflow process. Accordingly, the problem of empty soldering occurs during a soldering process, and as a result, the flash memory may suffer a short circuit problem. This is also one of the reasons why the yield rate of the manufacturers of the miniSD memory card cannot break through 60%.

Some PCB manufacturers have suggested amending the layout of the PCB to connect the plate edges, i.e., through the manner of the edge connector of gold fingers, which however cannot overcome the aforementioned problems, so the yield rate cannot be enhanced efficiently.

In addition, some SMT manufacturers also employ a two-piece manufacturing carrier, including a bottom plate and a top cover, in which the top cover is used to press each flash memory, so as to overcome the bowing problem of the PCB. However, the conventional method is merely to add the top cover in the reflow process, which can only avoid thermal deformation occurring in the reflow process, but cannot overcome the bowing problem that has already occurred before the material of the PCB is purchased. Therefore, the two-piece manufacturing carrier only may enhance the yield rate by 10%-15%, but the additional operation steps wastes some extra working hours.

SUMMARY OF THE INVENTION

The present invention is directed to a carrier for manufacturing a memory device, a method using the same, and a portable memory device using the manufacturing method, capable of efficiently overcoming the bowing problem of the PCB and significantly enhancing the yield rate.

The present invention is directed to a carrier for manufacturing a memory device, a method using the same, and a portable memory device using the manufacturing method, capable of efficiently solving the problems that, during an SMT process, the pieces cannot be assembled successfully, an integrated circuit (IC) to be adhered is offset, or empty soldering or a short circuit occurs, so as to greatly enhance the yield rate.

The present invention provides a carrier for manufacturing a memory device, which includes a bottom plate, an intermediate cover, and a top cover. A PCB is placed and fixed on the bottom plate, which is used for forming a plurality of memory elements. The intermediate cover is used to press peripheral regions of the PCB and to expose regions where the memory elements are formed on the PCB, such that the PCB may be closely attached to the surface of the bottom plate by fixing the intermediate cover. The top cover is used to cover the memory elements formed on the PCB, and the memory elements are clamped by an external force, so as to protect the memory elements from being affected by the PCB due to thermal stress deformation.

The present invention provides a manufacturing method using a carrier for manufacturing a memory device, in which the carrier for manufacturing a memory device includes a bottom plate, an intermediate cover, and a top cover. The manufacturing method includes the steps as follows. Firstly, the PCB is fixed on the bottom plate, which is used for forming a plurality of memory elements. Next, a solder paste printing process is performed. After that, the intermediate cover is placed on the bottom plate and the PCB, which presses peripheral regions of the PCB and exposes regions where the memory elements are formed on the PCB; and the printed circuit board is closely attached onto the surface of the bottom plate by fixing the intermediate cover. Thereafter, the assembling process of the SMT is performed. Then, the top cover is placed on the intermediate cover to press the memory elements and clamp the memory elements by an external force, so as to protect the memory elements from being affected by the PCB due to thermal stress deformation.

The present invention provides a portable memory device using the above manufacturing method, which is an NAND flash memory device meeting the miniSD specification requirement, and the method of manufacturing the same includes the steps as follows. Firstly, a PCB with a thickness lower than 0.2 mm is fixed on the bottom plate, which is used for forming a plurality of memory elements meeting the miniSD specification. Then, a solder paste printing process is performed. After that, the intermediate cover is placed on the bottom plate and the PCB to press peripheral regions of the PCB and expose regions where the memory elements are formed on the PCB; and the PCB is closely attached onto the surface of the bottom plate by fixing the intermediate cover. Thereafter, the assembling process of the SMT is performed. Then, the top cover is placed to press each memory element, and the memory elements are clamped by an external force, so as to protect the memory elements from being affected by the PCB due to thermal stress deformation.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A-1C and 2A-2C respectively show a carrier for manufacturing a memory device according to a preferred embodiment of the present invention, in which

DESCRIPTION OF EMBODIMENTS

The carrier for manufacturing a memory device, the method using the same, and the portable memory device using the manufacturing method provided by the present invention is capable of efficiently overcoming the bowing problem of the printed circuit board (PCB) and also efficiently solving the problems that, during a surface mounted technology (SMT) process, pieces cannot be assembled successfully, an integrated circuit (IC) to be adhered is offset, or the empty soldering or short circuit problem occurs, so as to greatly enhance the yield rate of the manufacturing process.

Figure 1A:
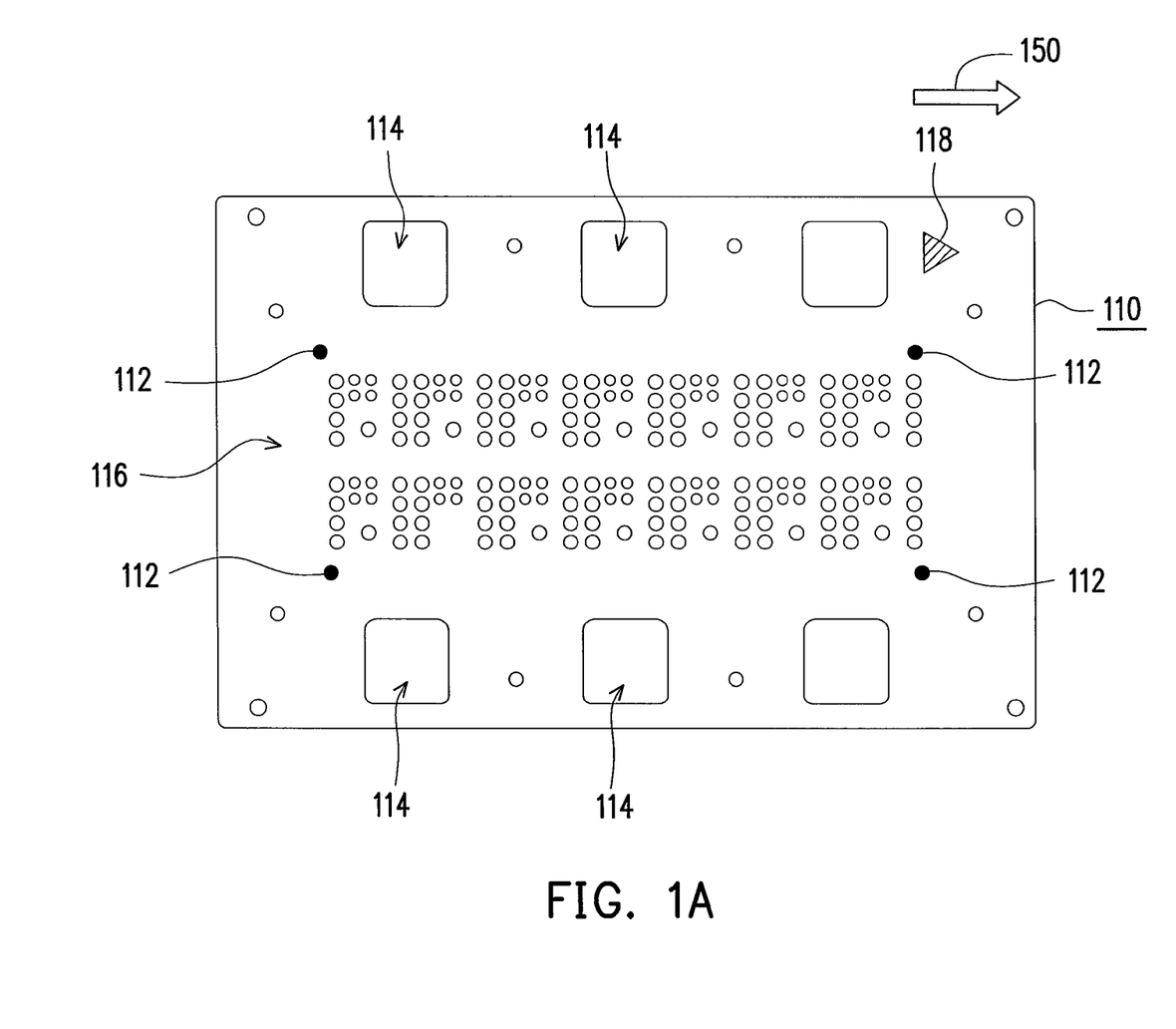
FIGS. 1A, 1B, and 1C are schematic top views of a bottom plate, an intermediate cover, and a top cover respectively.
Figure 1B:
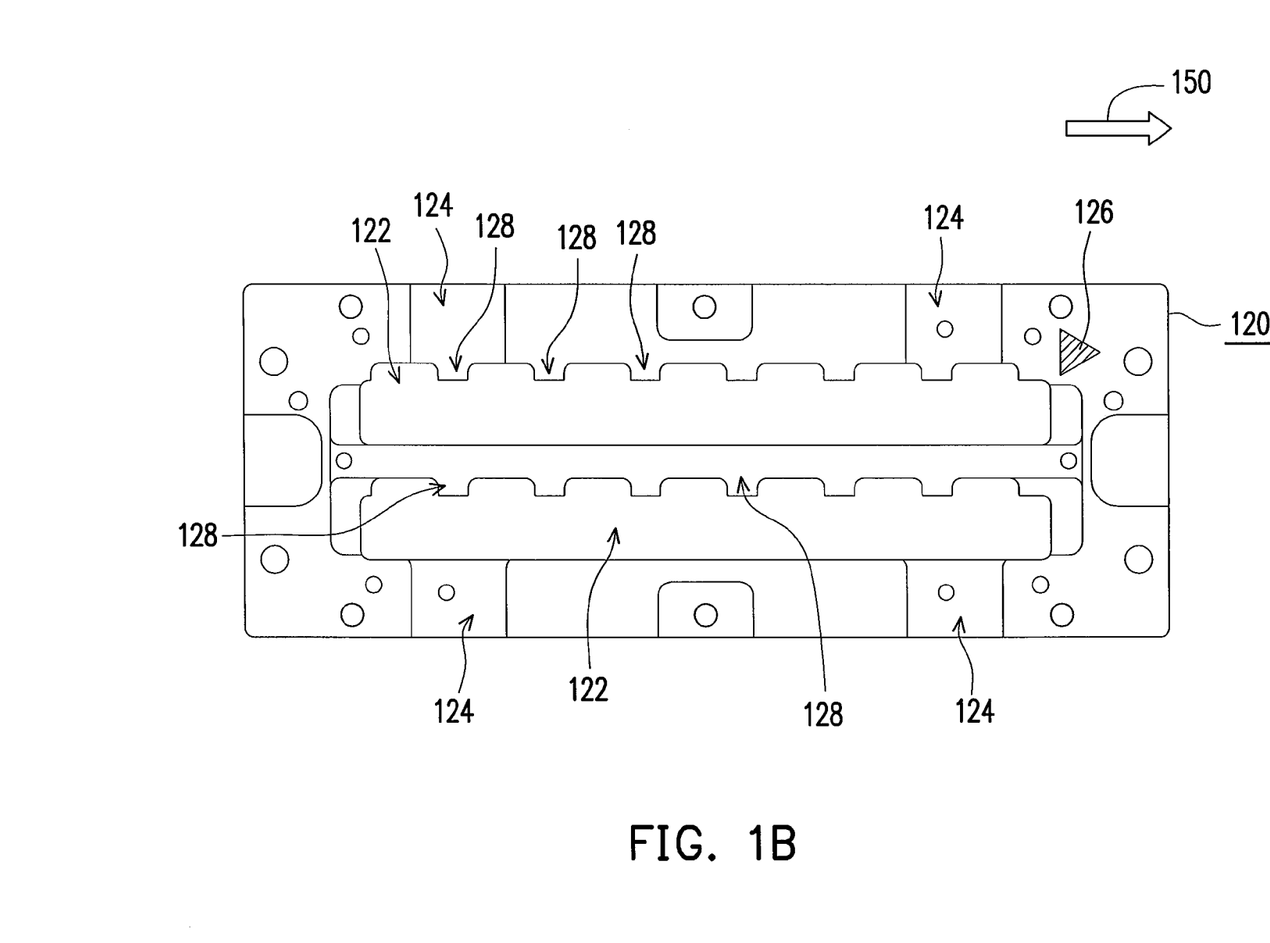
Figure 1C:
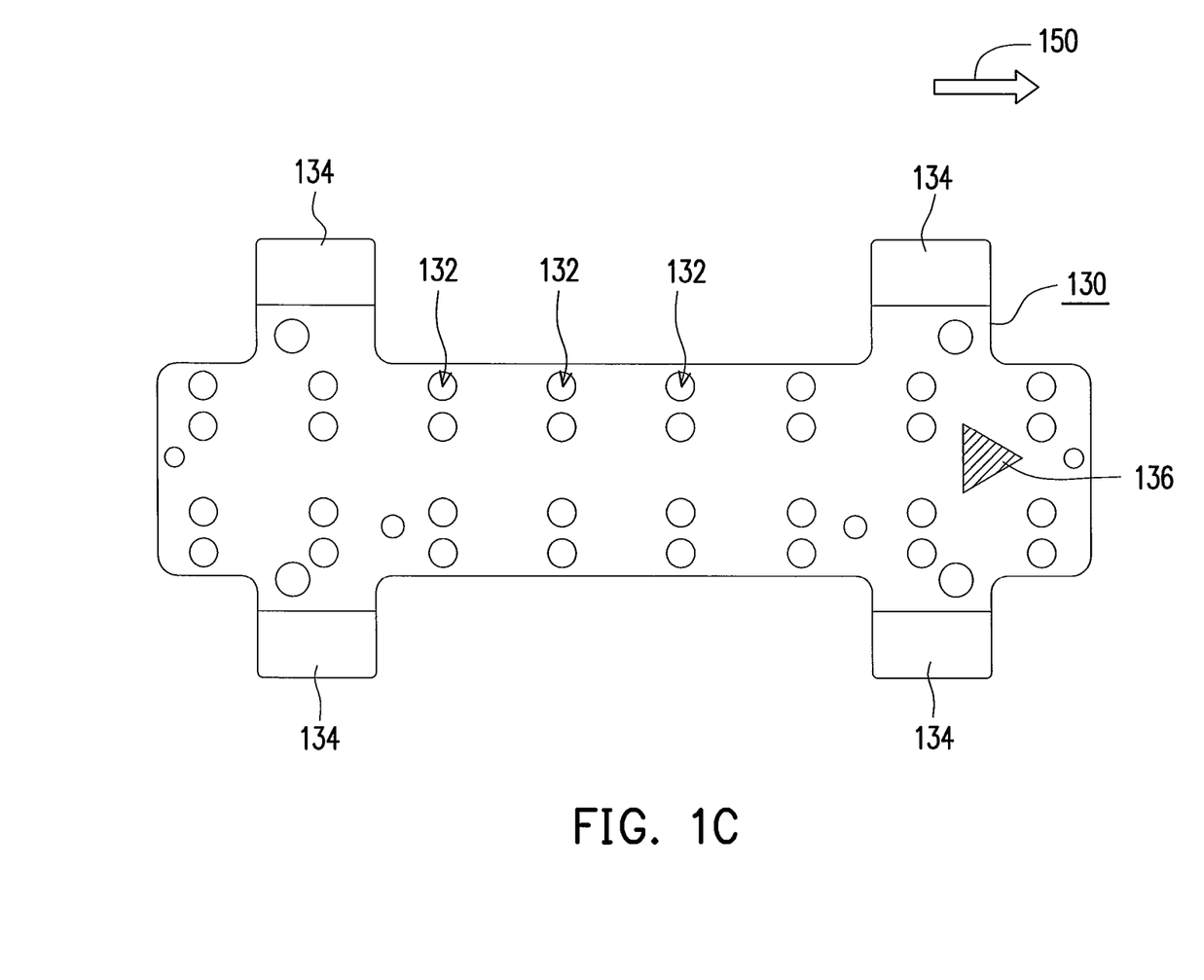
Figure 2A:
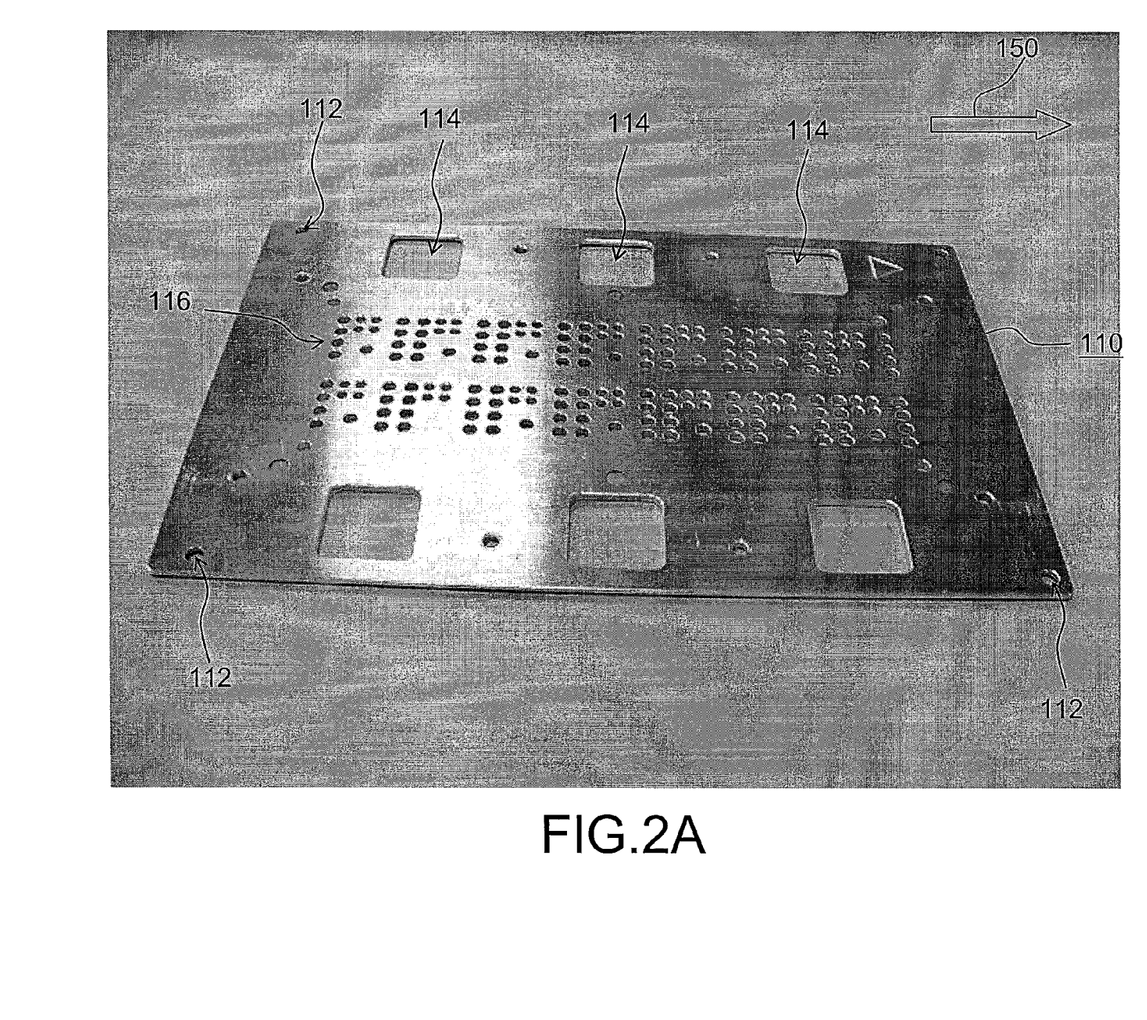
FIGS. 2A, 2B, and 2C are side views of the bottom plate, the intermediate cover, and the top cover respectively.
Figure 2B:
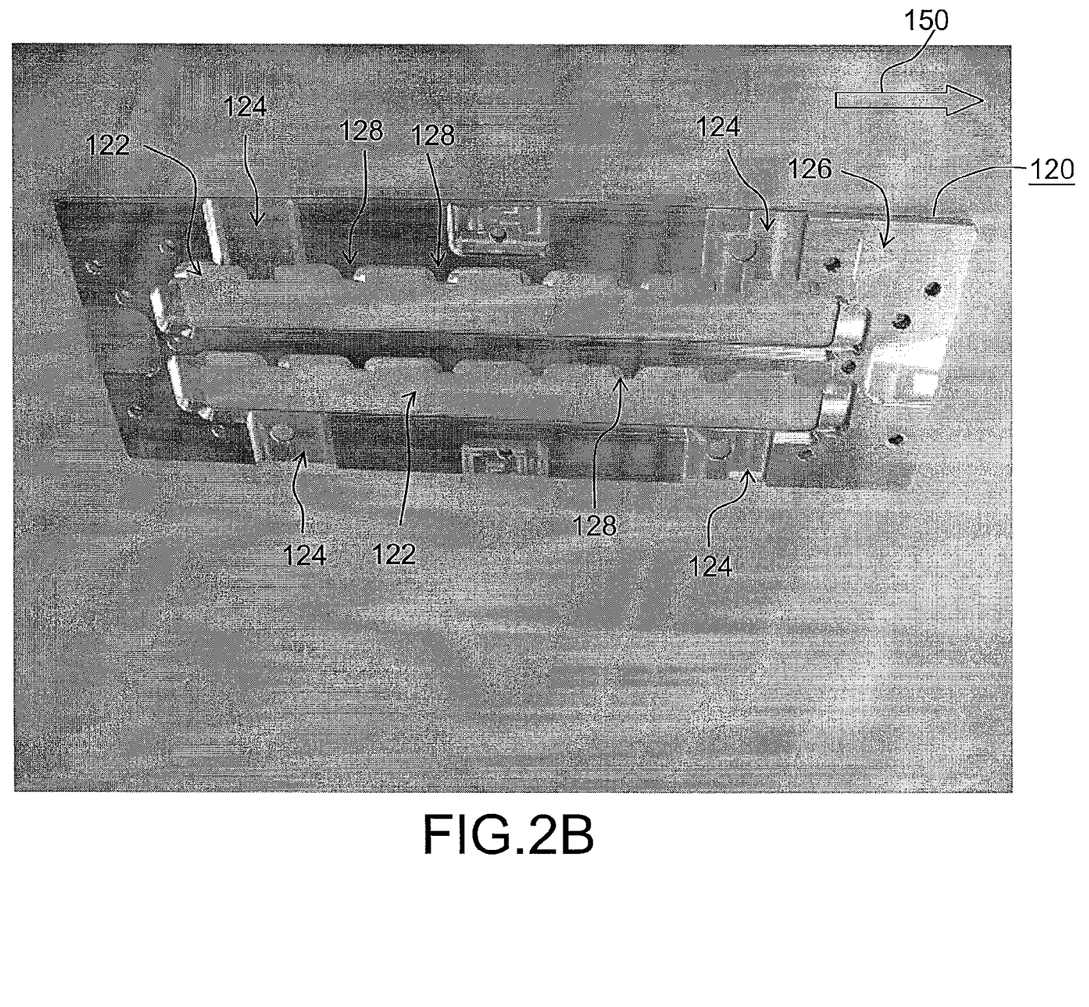
Figure 2C:
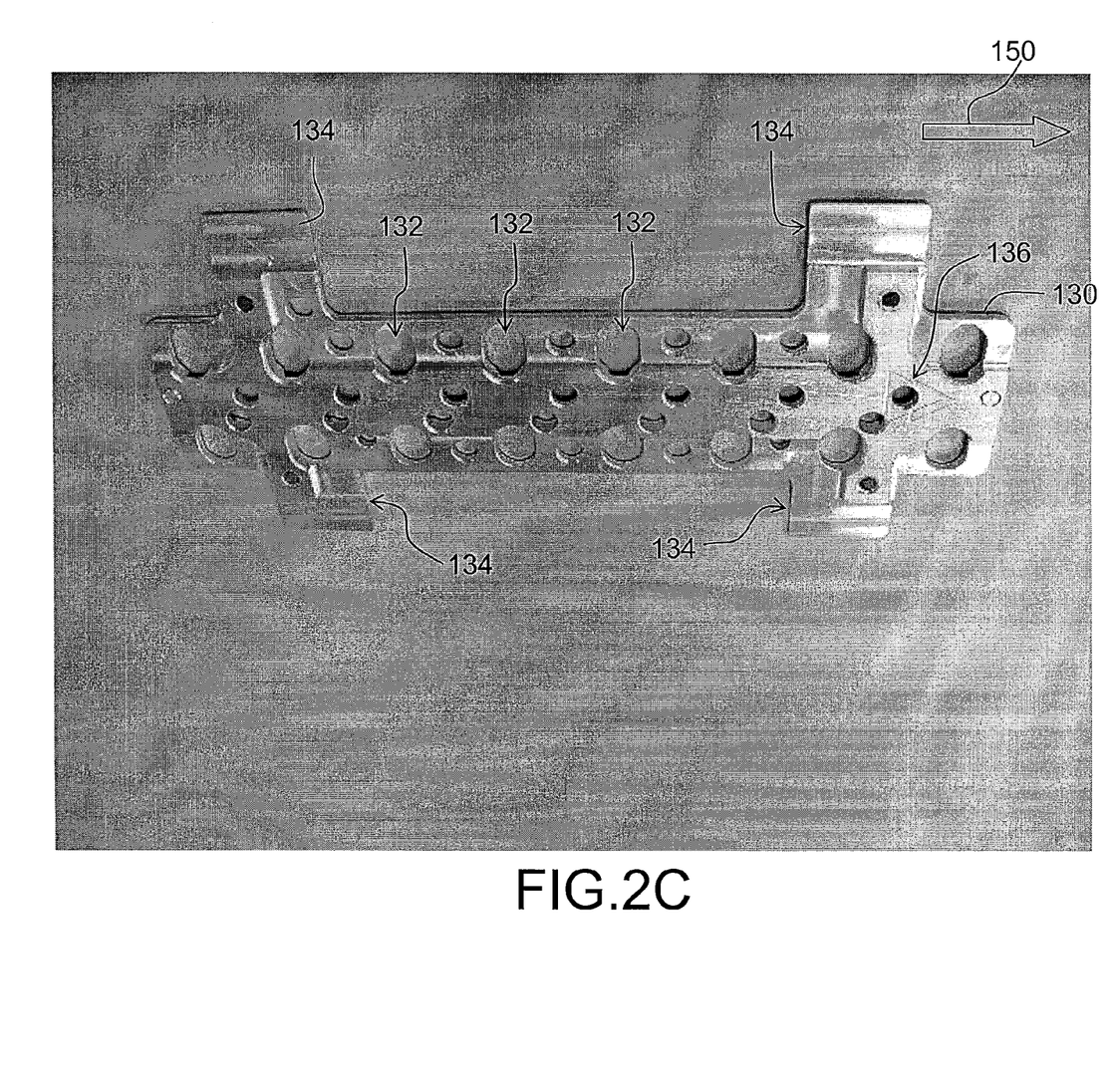

The carrier for manufacturing a memory device provided by the present invention is a three-piece carrier, which includes a bottom plate, an intermediate cover, and a top cover. FIGS. 1A, 1B, and 1C are schematic top views of the bottom plate, the intermediate cover, and the top cover, and FIGS. 2A, 2B, and 2C are side views of the bottom plate, the intermediate cover, and the top cover. In order to illustrate clearly, the present invention will be described below with reference to FIGS. 1A-1C and 2A-2C.

FIGS. 1A and 2A are respectively a schematic top view and a side view of a bottom plate 110 of the carrier for manufacturing a memory device according to an embodiment of the present invention. The bottom plate 110 has four pillars 112 respectively disposed at four corners where the printed circuit board (PCB) of a flash memory will be fixed, such that the locating holes of the PCB are engaged with the pillars 112. The bottom plate 110 has a plurality of louvers 114 at four edges. In addition, the position 116, where the PCB of the flash memory will be placed, also has a plurality of louvers for dissipating heats generated during the manufacturing process. Additionally, in order to make the direction of the carrier be consistent, each piece in the three-piece carrier provided by the present invention has a direction mark, such that the pieces will not be placed incorrectly during the manufacturing process, for example, the bottom plate 110 in FIG. 1 has a direction mark 118 facing a predetermined direction 150.

FIGS. 1B and 2B are respectively a schematic top view and a side view of an intermediate cover 120 of the carrier for manufacturing a memory device according to an embodiment of the present invention. The intermediate cover 120 has two holes 122 disposed in the upside and downside for exposing the flash memory of the PCB and a plurality of grooves 124 for carrying the top cover, and further has a direction mark 126 to prevent the intermediate cover 120 from being placed incorrectly during the manufacturing process. In addition, a plurality of protruding portions 128 is formed at positions of the holes 122 for exposing the flash memory, which is used to further fix the PCB.

FIGS. 1C and 2C are respectively a schematic top view and a side view of the top cover 130 of the carrier for manufacturing a memory device according to an embodiment of the present invention. The top cover 130 includes a plurality of holes 132 disposed in upside and downside for exposing the flash memory and a plurality of protruding portions 134 for being placed in the grooves of the intermediate cover, and further has a direction mark 136 to prevent the top cover 130 from being placed incorrectly during the manufacturing process. The holes 132 may serve as louvers for dissipating heats generated by the flash memory.

Figure 3:
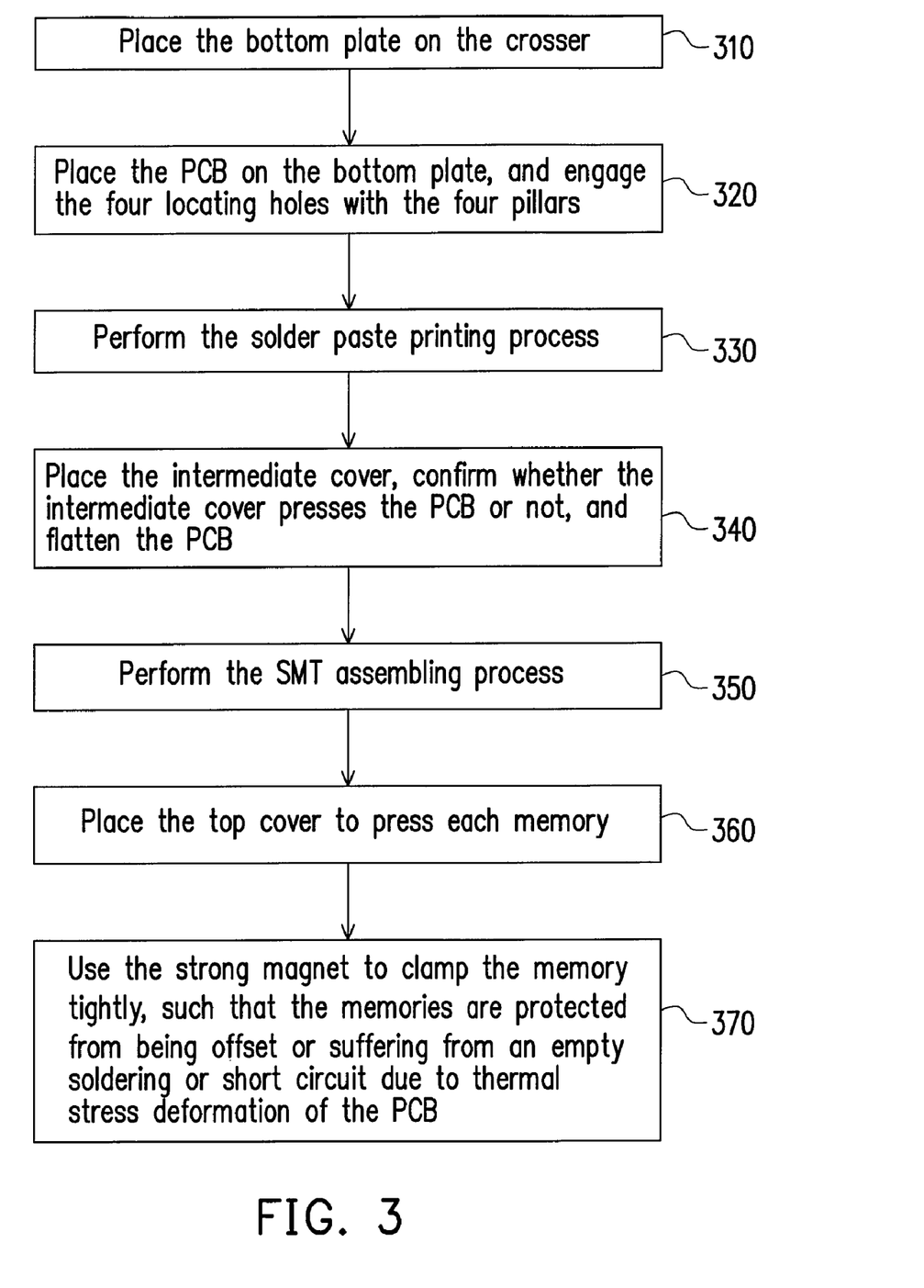
FIG. 3 is a detailed flow chart of a manufacturing method using the carrier for manufacturing a memory device according to the present invention.

FIG. 3 shows a detailed flow chart of the method using the carrier for manufacturing a memory device according to the present invention. Firstly, in Step 310, the bottom plate is placed on a crosser or another insulating manufacturing base. Next, in Step 320, the PCB is placed on the bottom plate, and the four locating holes of the PCB are engaged with the four pillars, so that the PCB is fixed thereon. Then, in Step 330, a solder paste printing process is performed to form a solder paste between the elements that should be adhered during the SMT process and the PCB. Then, in Step 340, the intermediate cover provided by the present invention is placed on the bottom plate and the PCB. Furthermore, it is confirmed whether the intermediate cover presses the PCB or not, and the PCB should be flattened. In an embodiment, for example, a strong magnet may be used on the intermediate cover, such that the intermediate cover may be combined with the bottom plate under a force, and the PCB may be flattened as expected.

Next, in Step 350, an SMT assembling process is performed to mount the necessary elements to be adhered. Then, in Step 360, a top cover is placed to press each memory. Subsequently, in Step 370, for example, the strong magnet is used to clamp the memories tightly. In this manner, the memories are protected from being offset or suffering from an empty soldering or a short circuit, when the thermal stress deformation occurs due to the reflow process of the PCB.

The detailed manufacturing method using the carrier for manufacturing a memory device provided by the present invention is further described below.

Figure 4A:
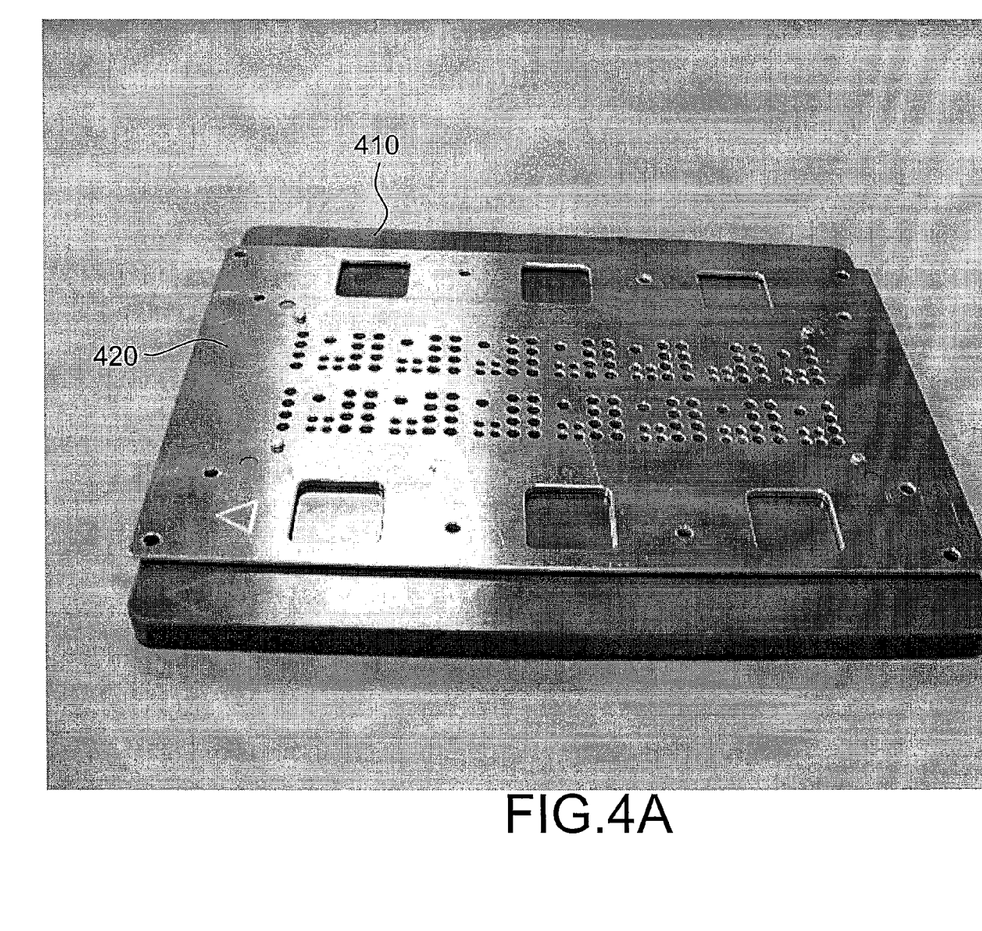
FIGS. 4A-4E are detailed flow charts of a manufacturing method using the carrier for manufacturing a memory device according to the present invention.
Figure 4B:
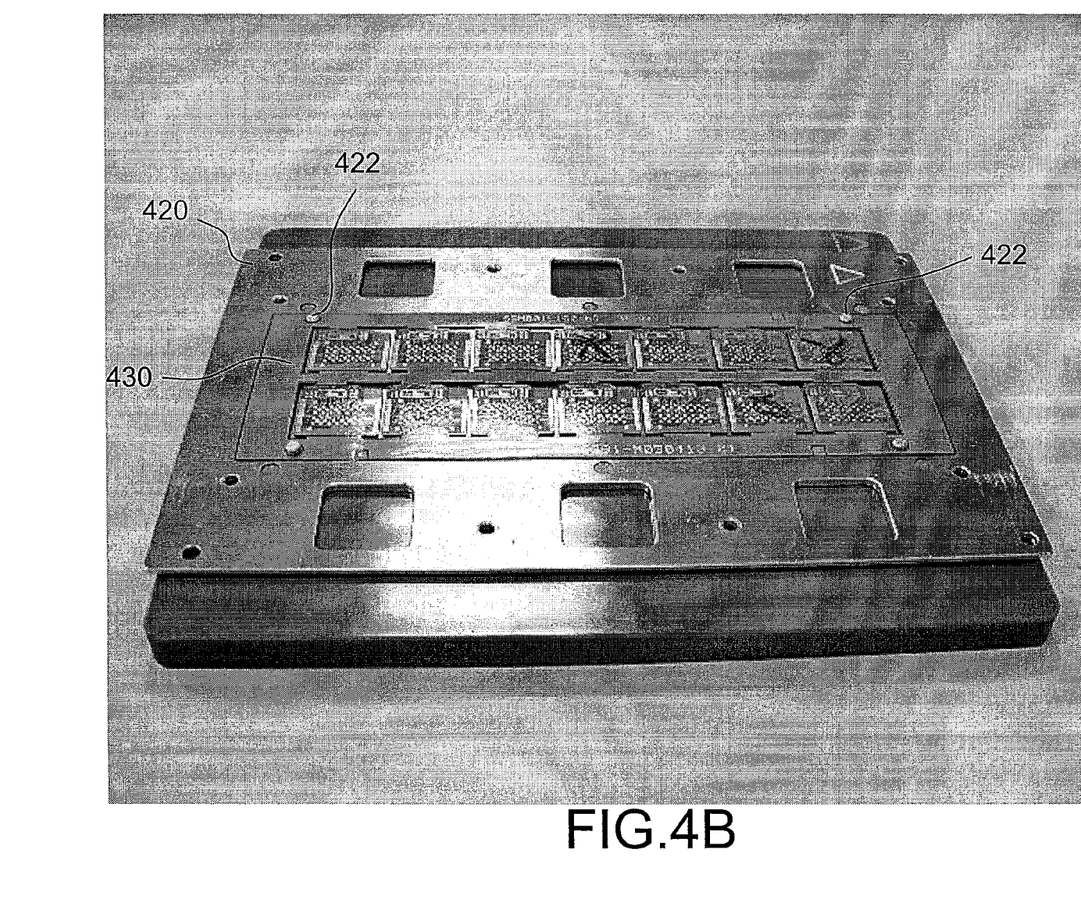
Figure 4C:
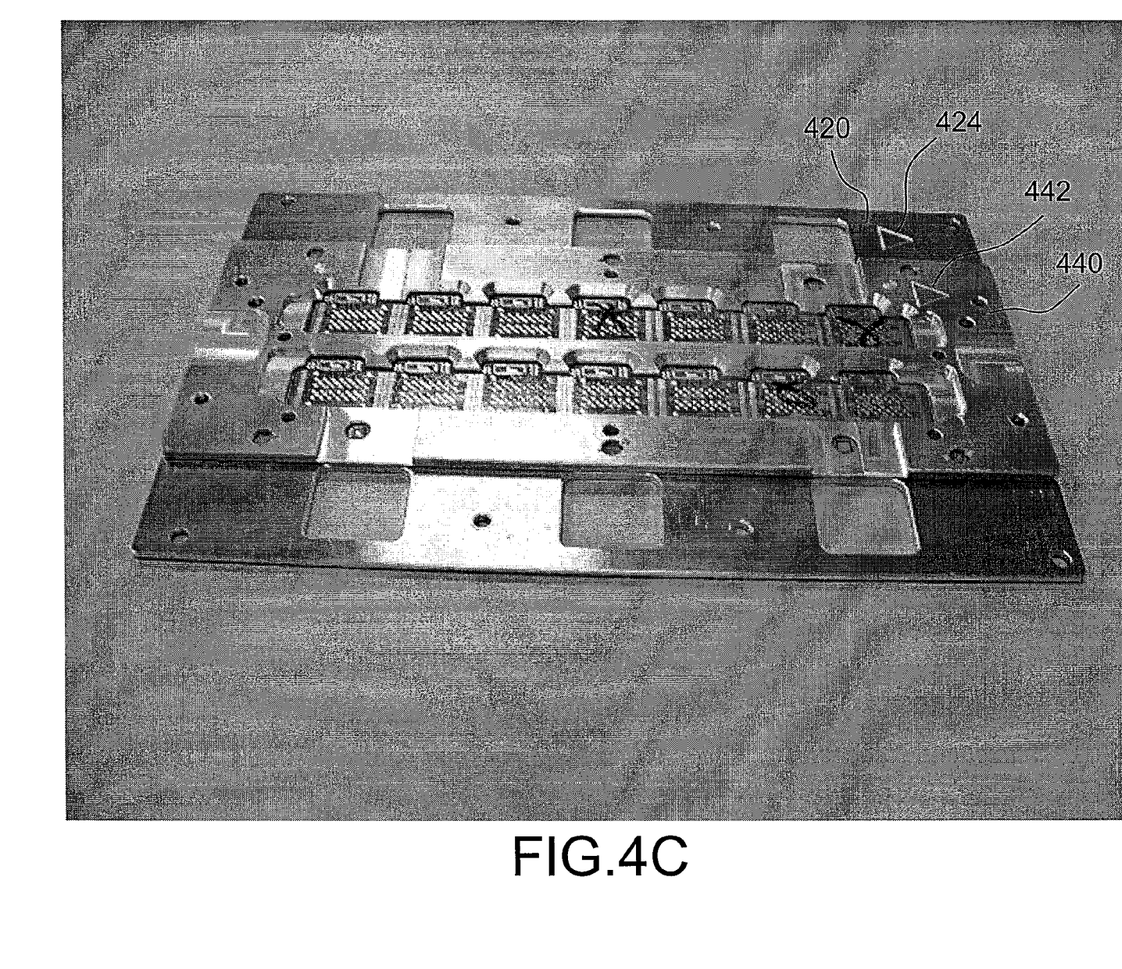

FIGS. 4A-4E are detailed flow charts of the manufacturing method using the carrier for manufacturing a memory device according to the present invention. Firstly, as shown in FIG. 4A, the bottom plate 420 is placed on the crosser 410. Next, as shown in FIG. 4B, the PCB 430 is placed on the bottom plate 420, and the four locating holes of the PCB 430 are engaged with the four pillars 422, so that the PCB is fixed thereon. Then, the solder paste printing process is performed to form the solder paste between the elements that should be adhered during the subsequent SMT process and the PCB. Then, as shown in FIG. 4C, the intermediate cover 440 is placed on the bottom plate 420 and the PCB 430, and the direction mark 442 of the intermediate cover 440 must be consistent with the direction mark 424 of the bottom plate 420.

Figure 4D:
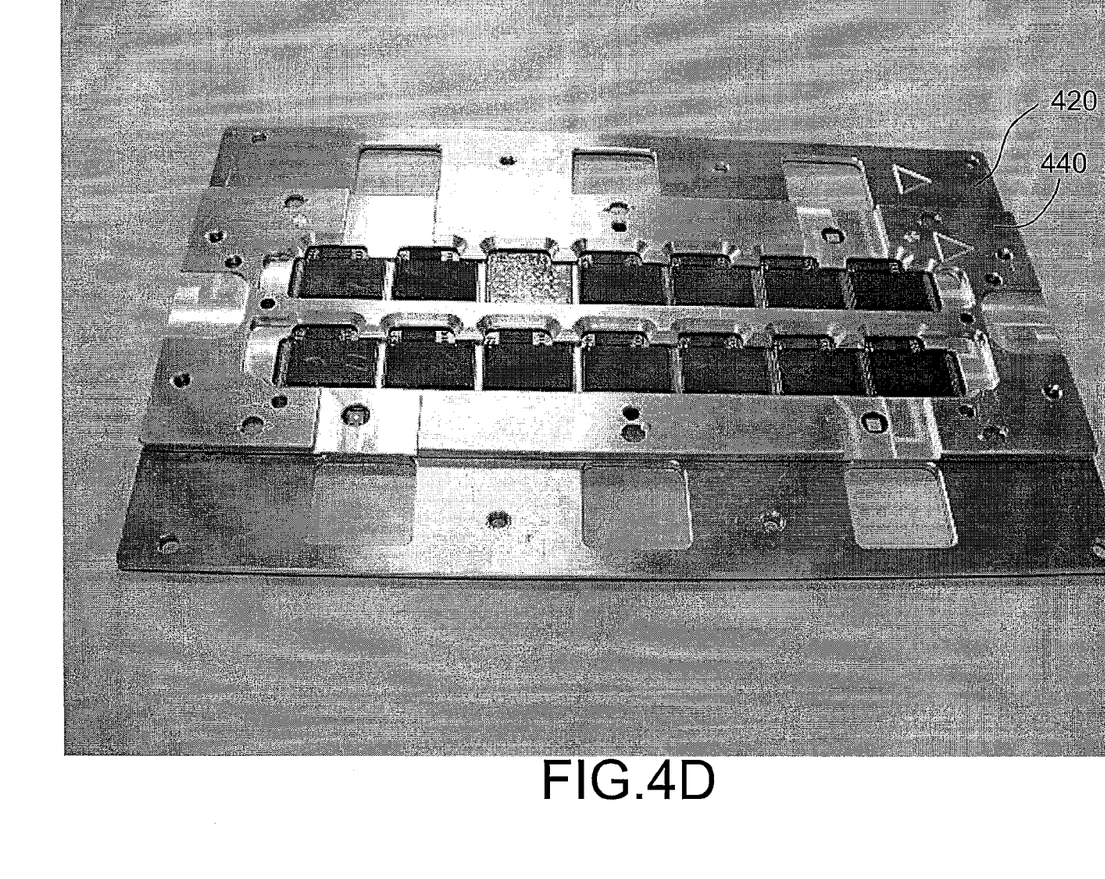
Figure 4E:
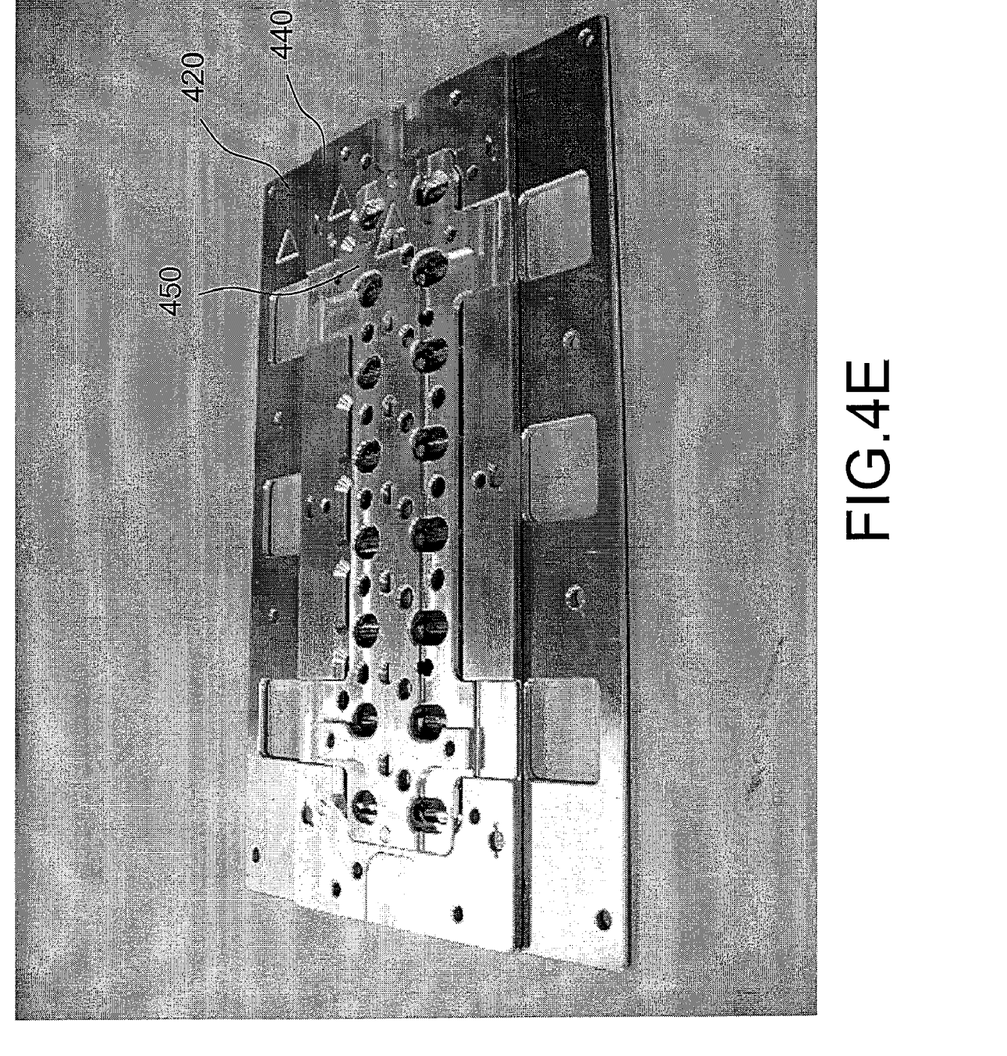

Subsequently, as shown in FIG. 4D, after the SMT assembling process, as shown in FIG. 4E, the top cover 450 is pressed to press each memory, for example, a strong magnet is used to clamp the memories tightly. In this manner, the memories are protected from being offset or suffering from an empty soldering or a short circuit problem, when the thermal stress deformation of the PCB 430 occurs during the subsequent reflow process of the PCB 430.

The carrier for manufacturing a memory device and the manufacturing method provided by the present invention is capable of efficiently overcoming the bowing problem of the PCB and also efficiently solving the problems that, during the surface mounted technology (SMT) process, pieces cannot be assembled successfully, an integrated circuit (IC) to be adhered is offset, or the empty soldering or short circuit occurs, which thus greatly enhancing the yield rate.

If the carrier for manufacturing a memory device and the manufacturing method are applied in manufacturing an NAND flash memory device meeting the miniSD specification (referred as miniSD memory card below), the NAND flash memories are arranged in a form of "pages", and each page has a storage space of 256 or 512 bytes and an assistant storage capacity of 8-16 bytes. Recently, an NAND memory with each page having a main storage space of 2048 bytes and an assistant storage space of 64 bytes has been introduced. The assistant storage space is mainly used to store error correction codes (ECCs), damaged memory marks, and data about file systems. These pages constitute a block. The NAND flash memory is read and written "page" by "page"; and the data is deleted "block" by "block".

At this time, the size of the miniSD memory card is about 20 millimeter (mm)×21.5 mm×1.4 mm. Since the thickness of the miniSD memory card is merely 1.4 mm, the thickness of the employed PCB must be lower than 0.2 mm. However, such a thin PCB may suffer from serious problems in the conventional process, and the yield rate cannot be enhanced efficiently. However, through the carrier for manufacturing a memory device and the manufacturing method provided by the present invention, the yield rate may be increased to over 90-95%. In another exemplary embodiment of the present invention, the carrier for manufacturing a memory device and the manufacturing method are also applied in manufacturing an NAND flash memory device formed as a memory card with a profile that is not over 31 mm in length, 20 mm in width, and 1.6 mm in thickness.

In addition, it takes about 80 seconds to manufacture one panel of a flash memory, including the SMT assembling, visual inspection, changing the top cover, and clamping it out by using a clip and so on. However, if the carrier for manufacturing a memory device and the manufacturing method provided by the present invention are used, since the strong magnet is used for adsorption, for example, and the time in changing the top cover is saved, a visual inspector may have sufficient time to correct the offset of the SMT assembling process. Therefore, it only takes 45-55 seconds to manufacture one panel of the flash memory under the same quantity conditions, so as to enhance both the yield rate and the efficiency.

The carrier for manufacturing a memory device and the manufacturing method provided by the present invention may also be applied in manufacturing a memory card requiring a quite thin PCB, for example, with a thickness of lower than 0.2 mm, such as, a compact flash (CF) memory card, a memory stick (MS) card, a memory stick duo (MS Duo), a multi media card (MMC), a reduced size multi media card (RS MMC), a secure digital (SD) card, a mini secure digital (Mini SD) card, a µ card, a reduced size µ (RS µ) card, and other small memory cards with similar functions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method using a carrier for manufacturing a memory device, wherein the carrier for manufacturing the memory device comprises a bottom plate, an intermediate cover, and a top cover, comprising:

fixing a printed circuit board on the bottom plate, wherein the printed circuit board is used for forming a plurality of memory elements;

performing a solder paste printing process;

placing the intermediate cover on the bottom plate and the printed circuit board to press peripheral regions of the printed circuit board and to expose regions where the memory elements are formed on the printed circuit board, and making the printed circuit board be closely attached to a surface of the bottom plate by fixing the intermediate cover;

performing a surface mounted technology (SMT) assembling process; and     placing the top cover to press the memory elements and clamp the memory elements by an external force, so as to protect the memory elements from being affected by the printed circuit board due to thermal stress deformation.

2. The manufacturing method using a carrier for manufacturing a memory device as claimed in claim 1, wherein one side of the intermediate cover has a first magnetic region, such that the intermediate cover presses the printed circuit board by a magnetic force when being placed on the bottom plate.

3. The manufacturing method using a carrier for manufacturing a memory device as claimed in claim 1, wherein when the top cover covers the memory elements formed on the printed circuit board, the external force exerted is an adsorption force of a magnet.

4. The manufacturing method using a carrier for manufacturing a memory device as claimed in claim 1, wherein the thickness of the printed circuit board is lower than 0.2 mm.

5. The manufacturing method using a carrier for manufacturing a memory device as claimed in claim 1, wherein the memory elements are NAND flash memories, and the formed memory device is a memory card meeting the miniSD specification.

6. The manufacturing method using a carrier for manufacturing a memory device as claimed in claim 1, wherein the memory elements are NAND flash memories, and the formed memory device is a memory card with a profile that is not over 31 mm in length, 20 mm in width, and 1.6 mm in thickness.

7. A method of manufacturing a miniSD memory device, comprising:
fixing a printed circuit board with a thickness lower than 0.2 mm on a bottom plate, wherein the printed circuit board is used for forming a plurality of miniSD memory elements;
performing a solder paste printing process;
placing an intermediate cover on the bottom plate and the printed circuit board to press peripheral regions of the printed circuit board and to expose regions where the memory elements are formed on the printed circuit board, and making the printed circuit board be closely attached to the surface of the bottom plate by fixing the intermediate cover;
performing a surface mounted technology (SMT) assembling process; and
placing a top cover to press the memory elements and clamp the memory elements by an external force, so as to protect the memory elements from being affected by the printed circuit board due to thermal stress deformation.

8. The method of manufacturing a miniSD memory device as claimed in claim 7, wherein when the top cover covers the memory elements formed on the printed circuit board, the external force exerted is an adsorption force of a magnet.

9. A miniSD memory device, comprising at least one NAND flash memory, wherein the miniSD memory device is manufactured by the method of manufacturing a miniSD memory device as claimed in claim 7.

10. A memory card with a profile that is not over 31 mm in length, 20 mm in width, and 1.6 mm in thickness, comprising at least one NAND flash memory, wherein the memory card is manufactured by the method of manufacturing a miniSD memory device as claimed in claim 7.

* * * * *